(12) United States Patent
Mazure et al.

(10) Patent No.: US 8,325,506 B2
(45) Date of Patent: Dec. 4, 2012

(54) DEVICES AND METHODS FOR COMPARING DATA IN A CONTENT-ADDRESSABLE MEMORY

(75) Inventors: Carlos Mazure, Bernin (FR); Richard Ferrant, Esquibien (FR)

(73) Assignee: Soitec, Bernin (FR)

( * ) Notice: Subject to any disclaimer, the term of this patent is extended or adjusted under 35 U.S.C. 154(b) by 182 days.

(21) Appl. No.: 12/974,916

(22) Filed: Dec. 21, 2010

(65) Prior Publication Data
US 2011/0170327 A1 Jul. 14, 2011

(30) Foreign Application Priority Data
Jan. 14, 2010 (FR) ...................................... 10 50242

(51) Int. Cl.
*G11C 15/00* (2006.01)
(52) U.S. Cl. ................ 365/49.1; 365/49.11; 365/49.15; 365/49.17; 365/51; 365/189.07; 365/72
(58) Field of Classification Search ................ 365/49.1, 365/49.11, 49.15, 49.17, 51, 189.07, 72
See application file for complete search history.

(56) References Cited

U.S. PATENT DOCUMENTS

| | | | |
|---|---|---|---|
| 4,169,233 A | 9/1979 | Haraszti | 307/355 |
| 5,028,810 A | 7/1991 | Castro et al. | 307/201 |
| 5,306,530 A | 4/1994 | Strongin et al. | 427/533 |
| 5,325,054 A | 6/1994 | Houston | 324/158 |
| 5,455,791 A | 10/1995 | Zaleski et al. | 365/185.26 |
| 5,557,231 A | 9/1996 | Yamaguchi et al. | 327/534 |
| 5,608,223 A | 3/1997 | Hirokawa et al. | 250/447.11 |
| 5,646,900 A | 7/1997 | Tsukude et al. | 365/205 |
| 5,753,923 A | 5/1998 | Mera et al. | 250/443.1 |
| 5,844,845 A | 12/1998 | Tahara | 365/189.05 |
| 5,869,872 A | 2/1999 | Asai et al. | 257/360 |
| 5,889,293 A | 3/1999 | Rutten et al. | 257/74 |
| 6,043,536 A | 3/2000 | Numata et al. | 257/347 |
| 6,063,686 A | 5/2000 | Masuda et al. | 438/406 |

(Continued)

FOREIGN PATENT DOCUMENTS
EP 1 081 748 A2 3/2001
(Continued)

OTHER PUBLICATIONS
U.S. Appl. No. 12/793,553, filed Jun. 3, 2010.
(Continued)

*Primary Examiner* — Viet Q Nguyen
(74) *Attorney, Agent, or Firm* — Winston & Strawn LLP

(57) ABSTRACT

The invention provides a content-addressable memory cell formed by two transistors that are configured so that one of the transistors is for storing a data bit and the other for is storing the complement of the data bit. Each transistor has a back control gate that can be controlled to block the associated transistor. The device also includes a comparison circuit that is configured to operate the first and second transistors in read mode while controlling the back control gate of each of the transistors so as to block the passing transistor if a proposed bit and the stored bit correspond. Then, the presence or absence of current on a source line linked to the source of each of the transistors indicates whether the proposed bit and the stored bit are identical or not. The invention also provides methods for operating the content-addressable memory cells of this invention, as well as content-addressable memories having a plurality of the content-addressable memory cells of this invention.

18 Claims, 10 Drawing Sheets

U.S. PATENT DOCUMENTS

| | | | |
|---|---|---|---|
| 6,072,217 A | 6/2000 | Burr | 257/351 |
| 6,108,264 A | 8/2000 | Takahashi et al. | 365/230.03 |
| 6,141,269 A | 10/2000 | Shiomi et al. | 365/200 |
| 6,240,004 B1 | 5/2001 | Kuo et al. | 365/49 |
| 6,300,218 B1 | 10/2001 | Cohen et al. | 438/423 |
| 6,317,349 B1 | 11/2001 | Wong | 365/49 |
| 6,372,600 B1 | 4/2002 | Desko et al. | 438/406 |
| 6,476,462 B2 | 11/2002 | Shimizu et al. | 257/627 |
| 6,498,057 B1 | 12/2002 | Christensen et al. | 438/149 |
| 6,611,023 B1 | 8/2003 | En et al. | 257/350 |
| 6,825,524 B1 | 11/2004 | Ikehashi et al. | 257/314 |
| 7,050,332 B2 | 5/2006 | Kamei et al. | 365/185.28 |
| 7,109,532 B1 | 9/2006 | Lee et al. | 257/133 |
| 7,112,997 B1 | 9/2006 | Liang et al. | 326/81 |
| 7,141,853 B2 | 11/2006 | Campbell et al. | 257/347 |
| 7,320,918 B2 | 1/2008 | Campbell et al. | 438/279 |
| 7,447,104 B2 | 11/2008 | Leung | 365/230.06 |
| 7,449,922 B1 | 11/2008 | Ricavy | 327/57 |
| 7,491,588 B2 | 2/2009 | Campbell et al. | 438/149 |
| 7,592,841 B2 * | 9/2009 | Kapoor | 326/121 |
| 7,859,308 B2 * | 12/2010 | O'Connor et al. | 326/93 |
| 8,223,582 B2 * | 7/2012 | Mazure et al. | 365/230.06 |
| 8,237,418 B1 * | 8/2012 | Krishna | 323/273 |
| 2001/0038299 A1 | 11/2001 | Afghahi et al. | 326/86 |
| 2001/0047506 A1 | 11/2001 | Houston | 716/4 |
| 2002/0105277 A1 | 8/2002 | Tomita et al. | 315/111.81 |
| 2002/0114191 A1 | 8/2002 | Iwata et al. | 365/185.23 |
| 2002/0185684 A1 | 12/2002 | Campbell et al. | 257/347 |
| 2003/0001658 A1 | 1/2003 | Matsumoto | 327/534 |
| 2003/0174558 A1 | 9/2003 | Kamei et al. | 365/200 |
| 2004/0108532 A1 | 6/2004 | Forbes | 257/296 |
| 2004/0146701 A1 | 7/2004 | Taguchi | 428/209 |
| 2004/0197970 A1 | 10/2004 | Komatsu | 438/163 |
| 2005/0077566 A1 | 4/2005 | Zheng et al. | 257/315 |
| 2005/0110078 A1 | 5/2005 | Shino | 257/331 |
| 2005/0255666 A1 | 11/2005 | Yang | 438/401 |
| 2005/0276094 A1 | 12/2005 | Yamaoka et al. | 365/154 |
| 2006/0013028 A1 | 1/2006 | Sarin et al. | 365/49 |
| 2006/0013042 A1 | 1/2006 | Forbes et al. | 365/185.08 |
| 2006/0035450 A1 | 2/2006 | Frank et al. | 438/585 |
| 2006/0039173 A1 | 2/2006 | Noda | 365/49 |
| 2006/0220085 A1 | 10/2006 | Huo et al. | 257/296 |
| 2006/0226463 A1 | 10/2006 | Forbes | 257/301 |
| 2006/0267064 A1 | 11/2006 | Rosner et al. | 257/304 |
| 2006/0291321 A1 | 12/2006 | Leung | 365/230.06 |
| 2007/0029596 A1 | 2/2007 | Hazama | 257/296 |
| 2007/0029620 A1 | 2/2007 | Nowak | 257/369 |
| 2007/0063284 A1 | 3/2007 | Kawahara et al. | 257/351 |
| 2007/0075366 A1 | 4/2007 | Hamamoto | 257/347 |
| 2007/0076467 A1 | 4/2007 | Yamaoka et al. | 365/154 |
| 2007/0139072 A1 | 6/2007 | Yamaoka et al. | 326/33 |
| 2007/0152736 A1 | 7/2007 | Itoh et al. | 327/534 |
| 2007/0158583 A1 | 7/2007 | Cho | 250/440.11 |
| 2007/0171748 A1 | 7/2007 | Mukhopadhyay et al. | 365/208 |
| 2007/0241388 A1 | 10/2007 | Yamamoto et al. | 257/314 |
| 2007/0298549 A1 | 12/2007 | Jurczak et al. | 438/149 |
| 2008/0042187 A1 | 2/2008 | Hwang | 257/316 |
| 2008/0111199 A1 | 5/2008 | Kim et al. | 257/401 |
| 2008/0116939 A1 | 5/2008 | Takizawa | 326/103 |
| 2008/0144365 A1 | 6/2008 | Yamaoka et al. | 365/181 |
| 2008/0173916 A1 | 7/2008 | Nishihara | 257/298 |
| 2008/0203403 A1 | 8/2008 | Kawahara et al. | 257/80 |
| 2008/0251848 A1 | 10/2008 | Borot et al. | 257/365 |
| 2008/0253159 A1 | 10/2008 | Kajigaya | 365/51 |
| 2009/0003105 A1 | 1/2009 | Itoh et al. | 365/203 |
| 2009/0010056 A1 | 1/2009 | Kuo et al. | 365/184 |
| 2009/0086535 A1 | 4/2009 | Ferrant et al. | 365/174 |
| 2009/0096011 A1 | 4/2009 | Hong et al. | 257/321 |
| 2009/0096936 A1 | 4/2009 | Hamada et al. | 348/731 |
| 2009/0101940 A1 | 4/2009 | Barrows et al. | 257/204 |
| 2009/0111223 A1 | 4/2009 | Wiatr et al. | 438/155 |
| 2009/0121269 A1 | 5/2009 | Caillat et al. | 257/301 |
| 2009/0310431 A1 | 12/2009 | Saito | 365/207 |
| 2010/0032761 A1 | 2/2010 | Ding et al. | 257/350 |
| 2010/0035390 A1 | 2/2010 | Ding et al. | 438/152 |
| 2010/0079169 A1 | 4/2010 | Kim et al. | 326/120 |
| 2010/0117684 A1 | 5/2010 | Kim et al. | 326/120 |

FOREIGN PATENT DOCUMENTS

| | | |
|---|---|---|
| EP | 1 095 407 A1 | 5/2001 |
| EP | 1 199 745 A2 | 4/2002 |
| EP | 1 233 454 A2 | 8/2002 |
| EP | 1 357 603 A2 | 10/2003 |
| EP | 1 744 364 A2 | 1/2007 |
| FR | 2 925 223 | 6/2009 |
| JP | 04345064 A | 12/1992 |
| JP | 08255846 | 10/1996 |
| JP | 09232446 | 9/1997 |
| JP | 10125064 A | 5/1998 |
| JP | 2000196089 A | 7/2000 |
| JP | 2004303499 | 10/2004 |
| WO | WO 99/66559 | 12/1999 |
| WO | WO 2007/060145 A1 | 5/2007 |
| WO | WO 2008/134688 A1 | 11/2008 |
| WO | WO 2009/013422 A2 | 1/2009 |
| WO | WO 2009/028065 A1 | 3/2009 |
| WO | WO 2009/077538 A2 | 6/2009 |
| WO | WO 2009/085865 A1 | 7/2009 |
| WO | WO 2009/104060 A1 | 8/2009 |
| WO | WO 2010/007478 A1 | 1/2010 |

OTHER PUBLICATIONS

U.S. Appl. No. 12/793,515, filed Jun. 3, 2010.
U.S. Appl. No. 12/789,100, filed May 27, 2010.
U.S. Appl. No. 12/886,421, filed Sep. 20, 2010.
U.S. Appl. No. 12/880,806, filed Sep. 13, 2010.
U.S. Appl. No. 12/898,230, filed Oct. 5, 2010.
U.S. Appl. No. 12/942,754, filed Nov. 9, 2010.
U.S. Appl. No. 12/946,135, filed Nov. 15, 2010.
U.S. Appl. No. 12/961,293, filed Dec. 6, 2010.
U.S. Appl. No. 12/974,822, filed Dec. 21, 2010.
U.S. Appl. No. 12/984,466, filed Jan. 4, 2011.
U.S. Appl. No. 13/007,483, filed Jan. 14, 2011.
U.S. Appl. No. 13/013,580, filed Jan. 25, 2011.
U.S. Appl. No. 13/039,167, filed Mar. 2, 2011.
European Search Report Application No. EP 09290838.3 dated Feb. 16, 2010.
European Search Report Application No. EP 10 29 0217 dated Sep. 15, 2010.
European Search Report Application No. EP 10290181.6 dated Jan. 14, 2011.
John Barth et al., "A 500MHz Random Cycle 1.5ns-Latency, SOI Embedded DRAM Macro Featuring a 3T Micro Sense Amplifier", ISSCC 2007/Session 27/DRAM and eRAM /27.1, IEEE International Solid-State Circuits Conference, Digest of Technical Papers, pp. 486-487 and p. 617 (2007).
John Barth et al., "A 45nm SOI Embedded DRAM Macro for POWER7™ 32MB On-Chip L3 Cache", ISSCC 2010/Session 19/High-Performance Embedded Memory/19.1, IEEE International Solid-State Circuits Conference, Digest of Technical Papers, pp. 342-344 (2010).
Paul Beckett, XP-002579039, "Performance Characteristics of a Nanoscale Double-gate Reconfigurable Array", Proc. of SPIE, vol. 7268, pp. 72680E-1-72680E-12 (2008).
I. Hassoune et al. "Double-gate MOSFET Based Reconfigurable Cells", The Institution of Engineering and Technology, Electronics Letters, vol. 43, No. 23, 3 pages (2007).
K. Cheng, et al., "Extremely Thin SOI (ETSOI) CMOS with Record Low Variability for Low Power System-on-Chip Applications", IBM Research at Albany Nanotech, pp. 3.2.1-3.2.4( 2009).
P.J. Klim et al, "A 1 MB Cache Subsystem Prototype With 1.8 ns Embedded DRAMs in 45 nm SOI CMOS", IEEE, Journal of Solid-State Circuits, vol. 44, No. 4, pp. 1216-1226 (2009).
K. J. Kuhn, "Variation in 45nm and Implications for 32nm and Beyond", Intel, 2009 $2^{nd}$ International CMOS Variability Conference—London, pp. 1-86.
Choi Hoon, et al., XP-002579041, Improved Current Drivability With Back-Gate Bias for Elevated Source and Drain Structured FD-SOI SiGe MOSFET, Microelectronic Engineering, vol. 86, pp. 2165-2169 (2009).

D.E. Ioannou, et al. "Opposite-Channel-Based Injection of Hot-Carriers in SOI MOSFET's: Physics and Applications" IEEE Transactions on Electron Devices, vol. 45, No. 5, pp. 1147-1154 (1998).

K. Itoh, et al., "Impact of FD-SOI on Deep-Sub-100-nm CMOS LSIs—A View of Memory Designers" Central Research Laboratory, Tokyo, Japan, 2 pages.

K. Roy, et al. "Double-Gate SOI Devices for Low-Power and High-Performance Applications", IEEE Computer Society, The British Library, IEEE Xplore, 8 pages, (2006).

M. Mizukami, et al., "Depletion-type Cell-Transistor of 23 nm Cell Size on Partial SOI Substrate for NAND Flash Memory," Extended Abstracts of the 2009 International Conference on Solid State Devices and Materials, Sendai, pp. 865-866 (2009).

M. Matsumiya, et al., "A 15-ns 16-Mb CMOS SRAM With Interdigitated Bit-Line Architecture," IEEE Journal of Solid-State Circuits, vol. 27, No. 11, pp. 1497-1503 (1992).

S. Mukhopadhyay, et al., "A Novel High-Performance and Robust Sense Amplifier Using Independent Gate Control in Sub-50-nm Double-Gate MOSFET," IEEE Transactions on Very Large Scale Integration (VLSI) Systems, vol. 14, No. 2, pp. 183-192 (2006).

S. Mukhopadhyay, et al., "Design of High Performance Sense Amplifier Using Independent Gate Control in Sub-50nm Double-Gate MOSFET," Computer Society, Proceedings of the Sixth International Symposium on Quality Electronic Design (ISQED'05), The British Library, IEEE Xplore, 6 pages, (2010).

P. Nasalski, et al."An Innovative sub-32nm SRAM Voltage Sense Amplifier in Double-Gate CMOS Insensitive to Process Variations and Transistor Mismatch" The 15$^{th}$ IEEE International Conference on Electronics, Circuits and Systems, pp. 554-557, (ICECS 2008).

P. Nasalski, et al."SRAM Voltage and Current Sense Amplifiers in sub-32nm Double-Gate CMOS Insensitive to Process Variations and Transistor Mismatch" IEEE, The British Library, IEEE Xplore, pp. 3170-3173 (2009).

T. Ohtou, et al. "Threshold-Voltage Control of AC Performance Degradation-Free FD SOI MOSFET With Extremely Thin BOX Using Variable Body-Factor Scheme", IEEE Transactions on Electron Devices, vol. 54, No. 2, pp. 301-307, (2007).

R. Tsuchiya, et al., "Silicon on Thin BOX: A New Paradigm of The CMOSFET for Low-Power and High-Performance Application Featuring Wide-Range Back-Bias Control" 2004 IEEE, 4 pages.

R. Tsuchiya, et al., "Controllable Inverter Delay and Suppressing $V_{th}$ Fluctuation Technology in Silicon on Thin BOX Featuring Dual Back-Gate Bias Architecture," Central Research Laboratory, Tokyo, Japan, IEEE, pp. 475-478 (2007).

Wilhelmus A. M. Van Noije, et al., XP-002579040, "Advanced CMOS Gate Array Architecture Combining "Gate Isolation" and Programmable Routing Channels," IEEE Journal of Solid-State Circuits, Special Papers, vol. SC-20, No. 2, pp. 469-480 (1985).

M. Yamaoka, et al., "SRAM Circuit With Expanded Operating Margin and Reduced Stand-By Leakage Current Using Thin-BOX FD-SOI Transistors," IEEE Journal of Solid-State Circuits, vol. 41, No. 11, pp. 2366-2372 (2006).

M. Yamaoka, et al., "Dynamic-Vt Dual-Power-Supply SRAM Cell using D2G-SOI for Low-Power SoC Application," IEEE International SOI conference, Oct. 2004, pp. 109-111 (2004).

Ulicki, Bob et al., "De-Myth-tifying" the SOI Floating Body Effect, SOI Industry Consortium, pp. 2-7 (2009).

IPOS Search Report and Written Opinion Application No. SG 201009217.9 dated Apr. 12, 2012.

* cited by examiner

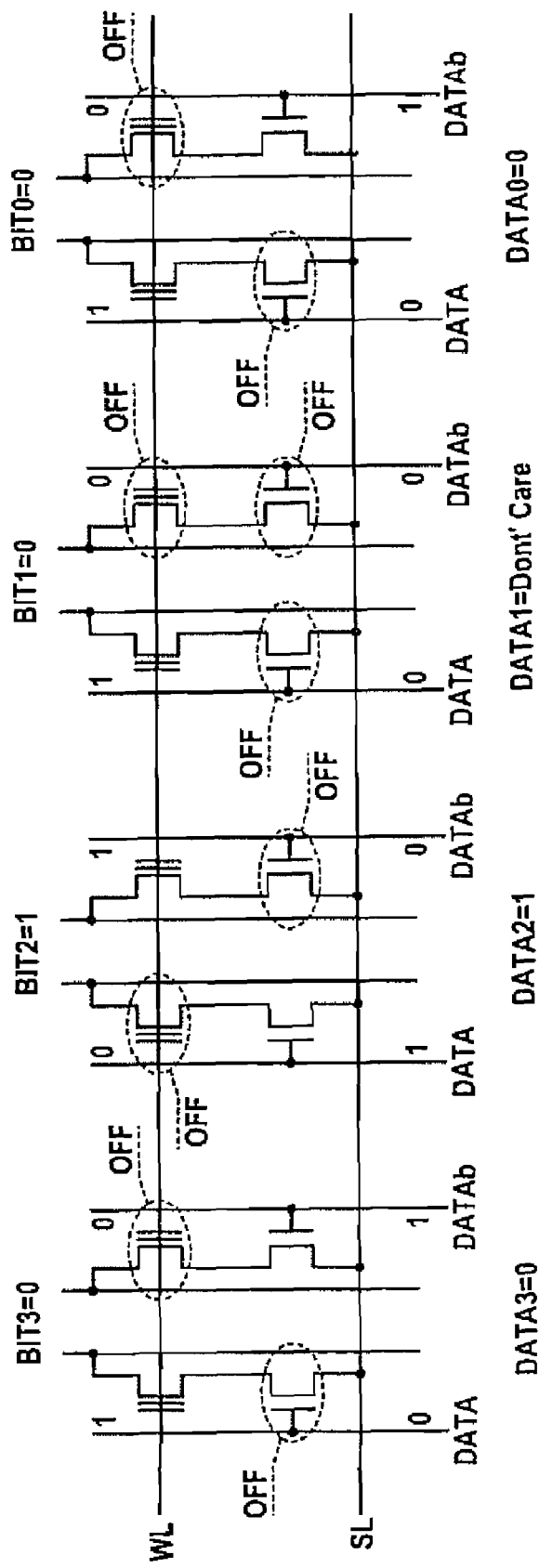

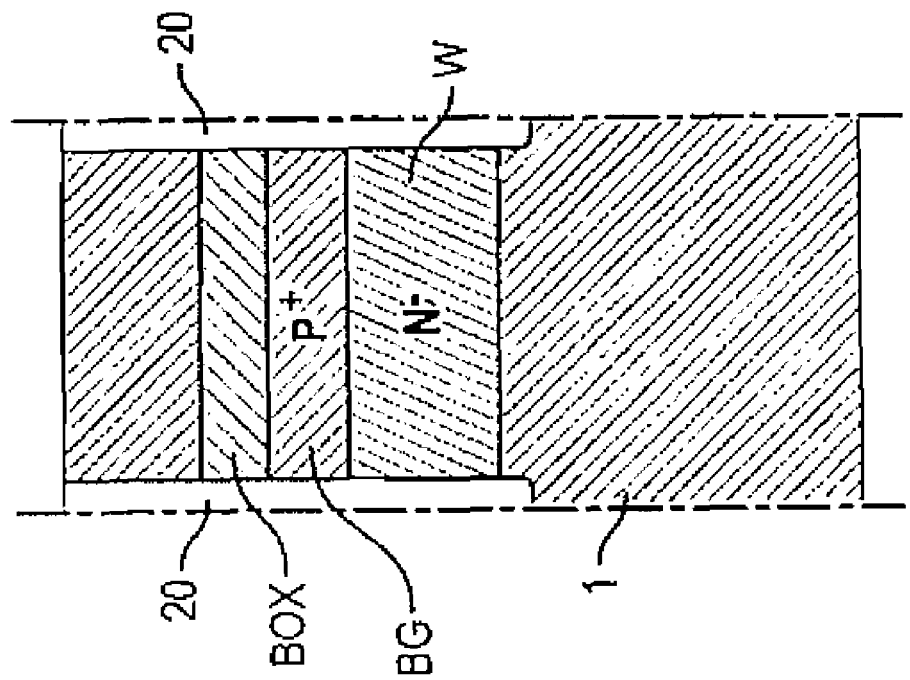
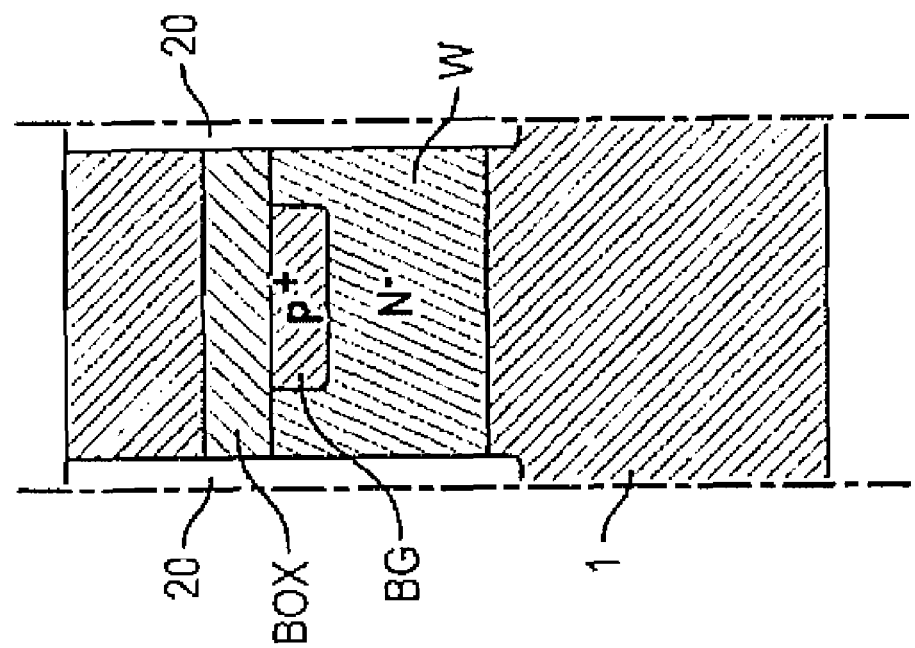

DEVICES AND METHODS FOR COMPARING DATA IN A CONTENT-ADDRESSABLE MEMORY

FIELD OF THE INVENTION

The field of the invention is semiconductor devices, and more particularly, the field of content-addressable memories on semiconductor-on-insulator (SeOI) substrates. Specifically, the invention provides devices and methods for comparing data in a content-addressable memory.

BACKGROUND OF THE INVENTION

A content-addressable memory (CAM) is a type of computer memory used in certain very high speed search applications. Unlike standard computer memories (of the random access memory RAM type, in particular) for which the user application supplies a memory address and the RAM returns the data stored at that address, a CAM memory is designed so that the user application supplies a data word and the CAM searches throughout its memory to determine whether this word is stored therein. If the word is found, the CAM returns a list of one or more addresses where the word has been found.

Because a CAM memory is designed to search throughout its memory in a single operation by performing multiple operations in parallel, this memory is faster than RAM in all search applications. However, unlike the RAM which has simple storage cells (the single function of a RAM is to store data), the CAM must also handle the comparison function. Each individual memory cell must thus have its own comparison circuit to detect a match between a bit stored in the cell and a proposed input (or query) bit. The physical size of a CAM cell (particularly in terms of surface units occupied) is therefore greater than that of a RAM cell.

FIG. 1 shows a conventional NOR-type CAM cell. Such a cell comprises ten transistors and typically occupies approximately 300 surface units (300 $F^2$). A CAM memory or this type is said to be binary in that it uses the systematic search for data containing only 1s and 0s.

Also known is a ternary CAM memory allowing for a third state of correspondence called "X" or "any" for one or more bits in the stored data word, so that flexibility can be added to the search. FIG. 2 shows a conventional NOR-type ternary CAM cell. This cell consists of 16 transistors and typically occupies 500 surface units.

Although a conventional CAM cell occupies a large surface area, it is known that there is a recurrent need in the field for miniaturization of semiconductor devices. Moreover, merely because of the large number of transistors and the need to supply a power supply line in the CAM memory array, a conventional CAM memory has the drawback of consuming a lot of power.

SUMMARY OF THE INVENTION

The present invention remedies the drawbacks of the art and now provides, according to a first aspect, a device for comparing data in a content-addressable memory. This device includes a semiconductor-on-insulator substrate; a memory cell formed in the substrate, the memory cell including a first transistor and a second transistor, each of the transistors having a front control gate and a back control gate that can be controlled to block the associated transistor, the transistors being configured so that, in order to store a data bit and the complement of the data bit, with one of the transistors passing and the other blocked; and a comparison circuit configured to operate the transistors in read mode by applying to both front control gates a nominal read voltage, to control the back control gates so as to block the passing transistor if a proposed bit and the stored bit correspond, and to detect a current on a source line linked to the source of each of the transistors. The presence or absence of such a current indicates whether the proposed bit and the stored bit are identical or not.

According to another aspect, the invention relates to a content-addressable memory cell comprising a first transistor designed to store a data bit and a second transistor designed to store the complement of the data bit, the transistors being produced on a semiconductor-on-insulator substrate and each of the transistors having a source, a drain, a front control gate and a back control gate that can be controlled to block the transistor, in which cell a source line is linked to the source of each of the transistors, a back gate line is associated with the back control gate of each of the transistors, the back gate lines being parallel with one another and perpendicular to the source line. A word line parallel to the source line can also be linked to the front control gate of each of the transistors.

According to yet another aspect, the invention relates to a memory array comprising a plurality of memory cells according to the invention as described herein.

According to yet another aspect, the invention relates to a method of comparing data in a content-addressable memory, the memory comprising a memory cell formed by a first transistor storing a data bit and a second transistor storing the complement of the data bit, the transistors being produced on a semiconductor-on-insulator substrate and each of the transistors having a front control gate and a back control gate that can be controlled to block the transistor, the method comprises the steps of:
- operating the first and second transistors in read mode by applying to the front control gate of each of the transistors a nominal read voltage,
- controlling the back control gate of each of the transistors, one with the proposed bit, the other with the complement of a proposed bit, to block the passing transistor among the transistors if the proposed bit and the stored bit correspond; and
- detecting the presence or absence of current on a source line linked to the source of each of the transistors to indicate whether the proposed bit and the stored bit are identical or not.

Further aspects and details and alternate combinations of the elements of this invention will be apparent from the following detailed description and are also within the scope of the inventor's invention.

BRIEF DESCRIPTION OF THE DRAWINGS

The present invention may be understood more fully by reference to the following detailed description of the preferred embodiment of the present invention, illustrative examples of specific embodiments of the invention and the appended figures in which:

FIG. 8 illustrates a comparison operation between a proposed 4-bit word and a word stored in 4 CAM memory cells according to the invention in the case of where one of the bits of the proposed word is ignored;

FIGS. 10*a*-10*e* illustrate various possible embodiments of a back control gate.

DETAILED DESCRIPTION OF THE PREFERRED EMBODIMENTS

Figure 1:
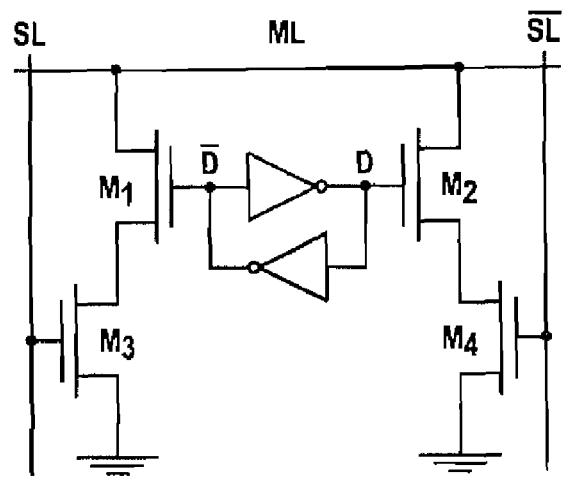
FIGS. 1 and 2, already discussed previously, illustrates a conventional NOR-type CAM cells, respectively binary and ternary (access transistors are not shown in the interests of clarity)

In this description, the word "passing", as used herein in, e.g., the phrase "the transistor is passing," means "on" or "conducting" or the equivalent. The word "blocked", as used herein in, e.g., the phrase "the transistor is blocked," means "of or "non-conducting" or the equivalent.

Preferred but non-limiting embodiments of the invention are now described.

The invention provides, according to a first embodiment, to a device for comparing data in a content-addressable memory comprising a memory cell storing a data bit BIT and a comparison circuit configured to detect whether a proposed bit DATA is identical to the stored bit BIT.

One embodiment of the invention relates to a device which includes:
  a memory cell formed by a first transistor storing a data bit and a second transistor storing the complement of the data bit, the transistors being produced on a semiconductor-on-insulator substrate and each of the transistors having a front control gate and a back control gate that can be controlled to block the transistor;
  a comparison circuit configured to:
    operate the first and second transistors in read mode by applying to the front control gate of each of the transistors a nominal read voltage while controlling the back control gate of each of the transistors, one with the proposed bit, the other with the complement of the proposed bit to block the passing transistor among said transistors if the proposed bit and the stored bit correspond; and
    detect the presence or absence of current on a source line linked to the source of each of the transistors to indicate whether the proposed bit and the stored bit are identical or not.

Some preferred, but non-limiting, aspects of this device are as follows:
  the comparison circuit is configured to supply the back control gate of one transistor with the complement of a proposed bit and to supply the back control gate of the other transistor with the proposed bit;
  the semiconductor-on-insulator substrate comprises a thin film of semiconductive material separated from a base substrate by an insulating layer, and the back control gate of a transistor is arranged in the base substrate under the insulating layer facing the channel of the associated transistor;
  the back control gate of each of the transistors is isolated in the base substrate by a well of opposite bias;
  the back control gate of each of the transistors has a working function;
  the comparison circuit is also configured to perform a ternary operation during which the proposed bit (and, accordingly, also the stored bit) is disregarded;
  during a ternary operation, the comparison circuit operates the first and the second transistors in read mode while controlling the back control gate of each of the transistors with substantially the same voltage chosen so as to block the normally passing transistor;
  it also comprises a circuit for controlling the memory cell configured to operate the transistors in read, programming and erase modes by controlling the back control gate of each of the transistors with substantially the same voltage chosen so that the passing transistor is not blocked;
  the control circuit is also configured to operate the transistors in a holding mode by controlling the back control gate of each of the transistors with substantially the same voltage chosen so that the passing transistor is blocked;
  the device comprises two parallel back gate lines, each of the back gate lines being linked to the back control gate of one of the transistors;
  a word line links the front control gates of the transistors, the word line being perpendicular to the back gate lines;
  the transistors are floating gate FET transistors, and the back control gate of a transistor is arranged in the base substrate, being separated from the channel of said transistor by the insulating layer;
  the transistors are floating channel FET transistors, and the back control gate of a transistor is arranged in the base substrate, being separated from the channel of said transistor by the insulating layer.

Figure 3:
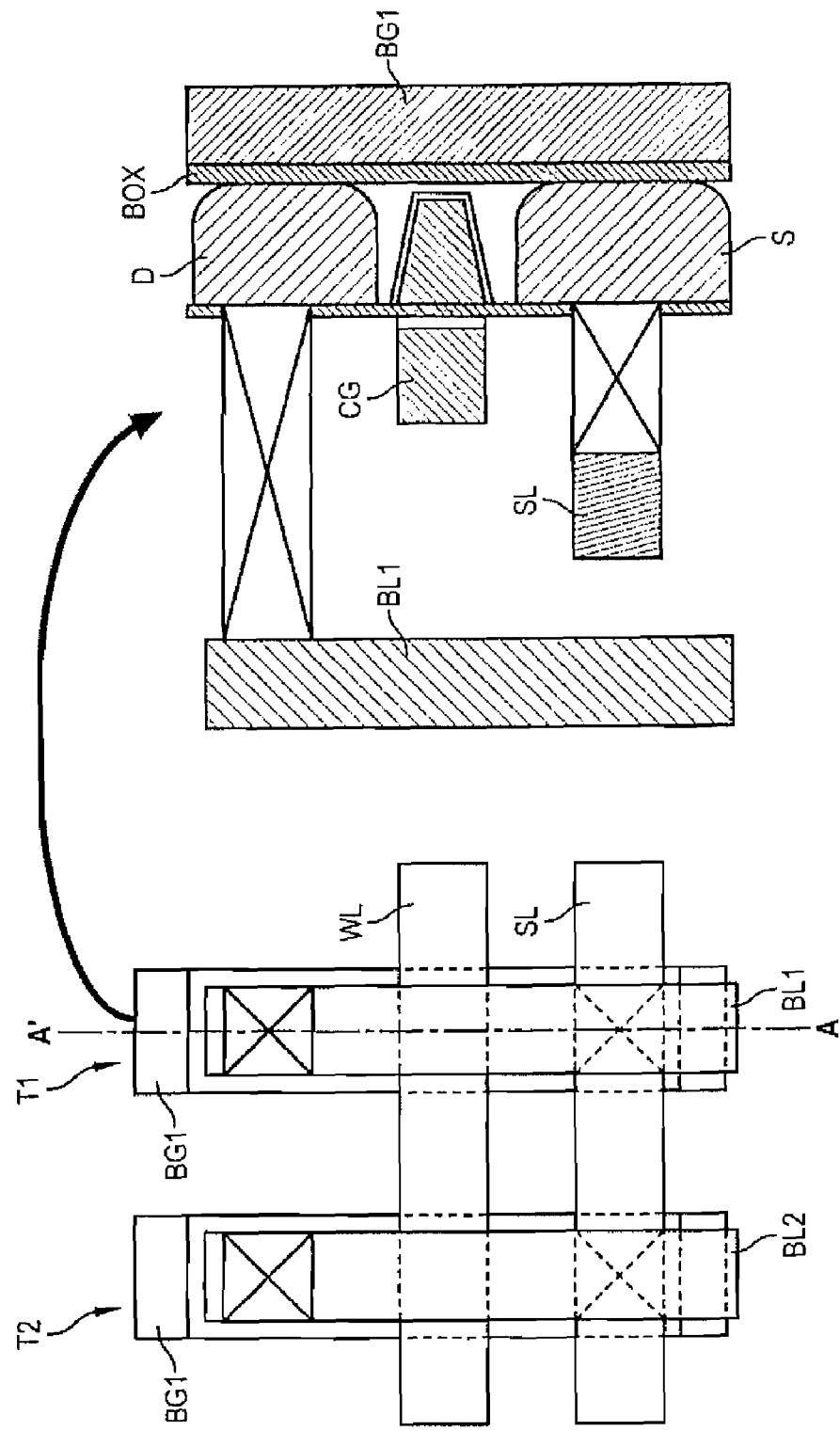
FIG. 3 illustrates one possible embodiment of a CAM memory cell with two transistors according to the invention.

FIG. 3 illustrates an embodiment of a memory cell is useful in a device for comparing data according to the first aspect of the invention. The memory cell comprises two transistors: a first transistor T1 stores the data bit BIT and the second transistor T2 stores the complement of the data bit ~BIT. One of the transistors is normally passing (the one storing the logic "0" value), whereas the other is normally blocked (the one storing the logic "1" value).

The transistors are produced on a semiconductor-on-insulator (SeOI) substrate and each of the transistors has a front control gate CG and a back control gate BG1, BG2 that can be controlled to block the transistor. The SeOI substrate comprises a thin semiconductor film separated from a base substrate by an insulating layer. The SeOI substrate can be, for example, a silicon-on-insulator SOI substrate. According to a preferred embodiment, the insulating layer is a buried oxide layer (BOX), for example, made of $SiO_2$.

Each transistor T1, T2 has a source region S, a drain region D and a channel C extending between the source region and the drain region. The front control gate CG extends in a manner conventionally known on the surface of the substrate, above the channel C. In the present invention, the back control gate BG1, BG2 of a transistor is arranged in the base substrate under the insulating layer (BOX) facing the channel of the associated transistor. The back control gate is typically produced by dopant implantation under the insulating layer.

The drain D and source S regions are preferentially in contact with the insulating layer (BOX) so that the transistor is fully depleted. The source S can thus be shared between two adjacent memory cells (see the two adjacent cells C1 and C2 in FIG. 4). Such sharing makes it possible to reduce the surface area occupied by a memory cell.

It will be understood that the invention is not limited to a fully depleted memory cell but also extends to a memory cell on partially depleted SeOI. In a manner known conventionally, it is necessary to isolate such cells along a line of the memory array in order to isolate the channels of adjacent cells from one another. This is conventionally done by the use of lateral isolating trenches (using the ST1—Shallow Trench Isolation—technique) extending depth-wise from the surface of the substrate to the BOX.

Figure 9A:
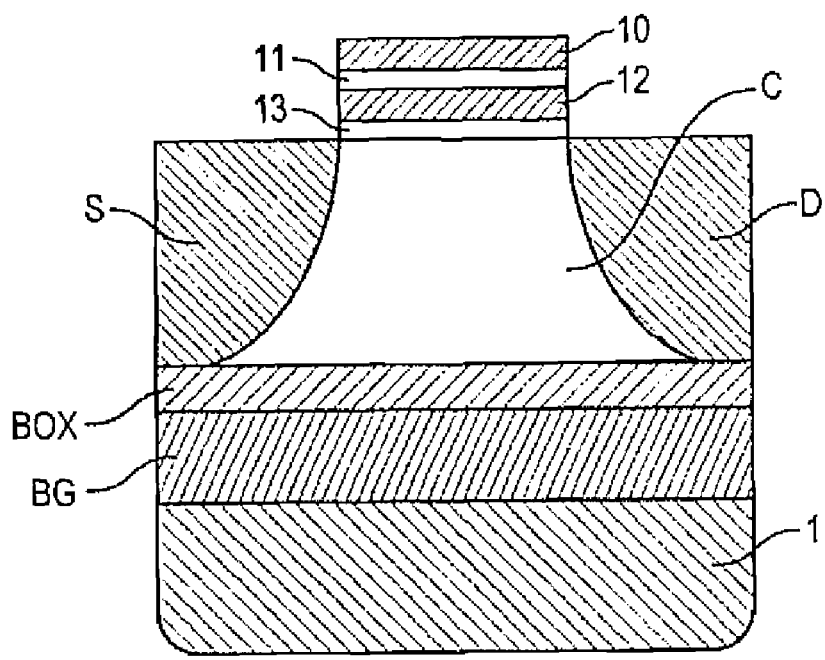
FIGS. 9*a* and 9*b* illustrate two possible embodiments of a flash-type transistor that can be used in a CAM memory according to the invention.

According to a preferential embodiment of the invention, the memory cell is formed by two floating gate flash transistors. According to a first variant represented in FIG. 9a, the flash transistors are planar: the floating gate 12 is arranged on the surface of the thin film of the SeOI substrate and is insulated from the channel C which extends in the thin film via a gate dielectric layer 13. The front control gate 10 is formed above the floating gate 12 while being insulated therefrom by an inter-gate dielectric layer 11.

Figure 9B:
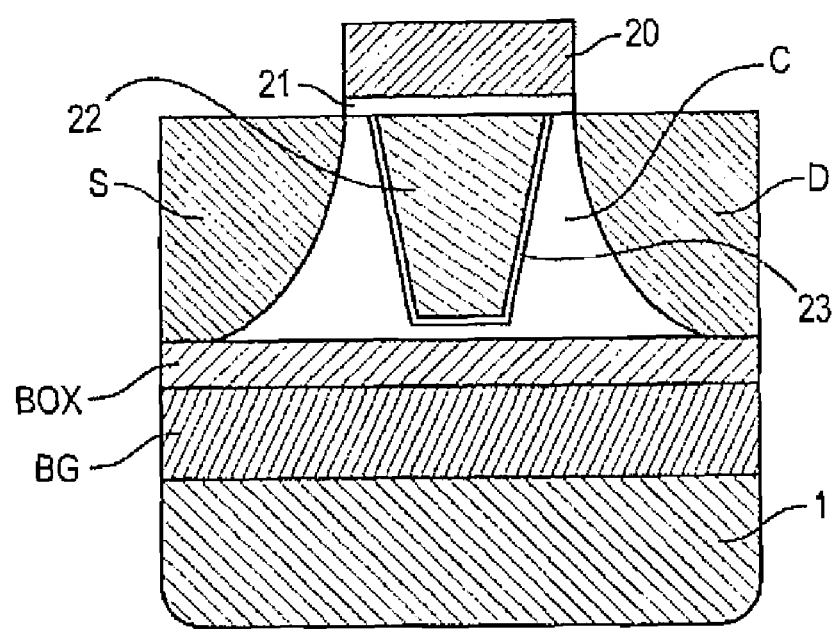

According to a second variant represented in FIG. 9b, the flash transistors are of the recessed floating gate type: the floating gate 22 is formed in a trench made in the channel C, and insulated from the channel via a gate dielectric layer 23 arranged on the walls of the trench. The front control gate 20 is formed on the surface of the substrate while being insulated from the floating gate 22 by an inter-gate dielectric layer 21.

The invention is not, however, limited to the use of flash transistors, but also extends to the use of DRAM on SeOI with floating gate transistors. According to a preferential variant, the front control gate of the DRAM transistors is recessed in the floating channel so as to increase its apparent length, while being insulated from the channel by a gate dielectric layer. RCAT (Recess Channel Array Transistor) type transistors are thus defined.

On the left of FIG. 3 there is a plan view of a CAM cell with two transistors T1, T2 (in this case, of flash type with recessed floating gate) according to the invention. The various access or control lines in the various regions of the transistors are: source line SL linking the source regions S of each of the transistors, bit lines BL1, BL2 for addressing the drain region of each of the transistors, word line WL linking the front control gate of each of the transistors, and back gate lines BG1, BG2 for addressing the back control gate of each of the transistors.

On the right of FIG. 3 there is a cross-sectional view along the axis AA' of the transistor T1 illustrating the arrangement of the source S, drain D and channel C regions, of the front control gate CG, of the back control gate BG1, and of the access lines BL1, WL, SL.

The active regions of the two transistors are arranged along two parallel strips. A word line WL is linked to the front control gate CG of each of the transistors, while a source line SL is linked to the source S of each of the two transistors. The word line WL and the source line SL are perpendicular to the active region strips, while the drain of each transistor is addressed by a bit line BL1, BL2.

The back control gates BG1, BG2 are parallel to the bit lines. They are thus perpendicular to the source line SL which makes it possible to compare in parallel all the bits of one and the same proposed word (the source line is in fact common to all the bits of a stored word). They are also thus perpendicular to the word line WL, which makes it possible to compare simultaneously the proposed word with several stored words on different rows (selective comparison by selection of a row via the corresponding word line WL).

The data comparison device according to this first embodiment comprises a comparison circuit (not represented) configured to operate the first and second transistors in read mode by applying to the front control gate of the transistors a nominal read voltage, while controlling the back control gate of each of the transistors, one back control gate with a proposed bit DATA, the other control gate with the complement ~DATA of the proposed bit, so as to block the passing transistor among said transistors if the proposed bit and the stored bit match.

Thus, the back control gate of the normally passing transistor (the one storing the logic "1" value) is acted upon to block it in read mode if BIT and DATA match, and leave it passing if BIT and DATA do not match.

A transistor whose channel has an N-type conductivity and a back control gate of P conductivity (the back control gate is then said to have a working function) has a very high threshold voltage. This threshold voltage can be reduced by applying a positive voltage to the back control gate. A transistor whose channel has an N-type conductivity and a back control gate of N conductivity (the back control gate is then said to be without working function) has a nominal threshold voltage that can be reduced by applying a positive voltage to the back control gate.

This variation of the threshold voltage of the transistor via the back control gate can be formulated according to $V_{th}=V_{t0}-\alpha \cdot V_{BG}$, in which $V_{th}$, represents the threshold voltage of the transistor, $V_{BG}$ the voltage applied to the back gate, $V_{t0}$ the nominal threshold voltage (which may be offset by the working function depending on whether an N- or P-type back control gate is used), and a α coefficient linked to the geometry of the transistor.

The coefficient α can notably be modelled according to $$\alpha = \frac{3 \cdot t_{ox1}}{t_{Si} + 3 \cdot t_{ox2}},$$

in which $t_{ox1}$ designates the thickness of the gate dielectric layer separating the front control gate from the channel, $t_{ox2}$ designates the thickness of the insulating layer separating the back control gate from the channel and $t_{Si}$ designates the thickness of the thin film. As an example, the thickness of the gate dielectric layer $t_{ox1}$ can be of the order of 15 Å or less for current or future technologies, the thickness of the thin film $t_{Si}$ can be of the order of 25 Å or less, and the thickness of the insulating layer $t_{ox2}$ can be of the order of 50 Å or more.

It will be noted that, with a greater insulating layer thickness, it may be difficult to completely block a transistor via its back control gate. But it does, however, remain possible to detect its residual current so that the principle behind the invention can also be applied in such a situation.

In different embodiments of the invention, a choice can be preferentially be made to act with the working function so as to reduce the thickness, doping and other constraints on the transistor. A choice can thus made to apply a zero voltage to the back control gate of a normally passing transistor in order to block it (the back control gate is then OFF). The threshold voltage of the transistor is effectively then very high. The application of a positive voltage to the control gate of a transistor (the back control gate is then ON) reduces the threshold voltage of the transistor, so that a normally passing transistor will not be blocked by the back control gate.

This means that the complement ~DATA of the proposed bit must be applied to the back control gate of the first transistor storing the data bit BIT, and the proposed bit DATA must be applied to the back control gate of the second transistor storing the complement ~BIT of the data bit.

Thus, if BIT=1, the back control gate of the first transistor is:
OFF, if BIT and DATA match, so that this transistor is then blocked and delivers no current,
ON, if BIT and DATA do not match, so that this transistor remains passing and delivers current.

It will be understood that the invention is not limited to the use of the working function, but extends to the case without working function. The invention is not moreover limited to the use of a zero or positive back control gate voltage but also extends to the use of a zero or negative back control gate voltage.

Various possible embodiments of a back control gate are detailed with reference to FIGS. 10a-10e. It will be noted that, in these figures, only the part that extends below the insulating layer is represented. Generally, the back control gate is formed by dopant implantation under the insulating layer.

Figure 10A:
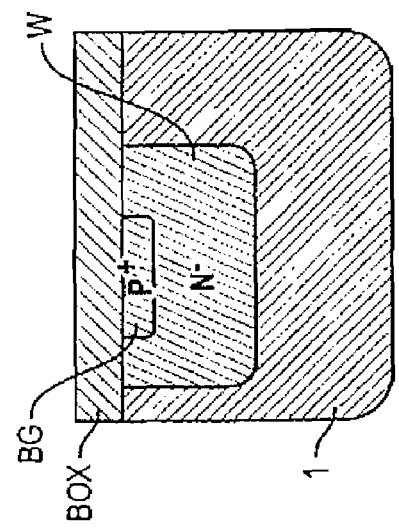
Figure 10B:
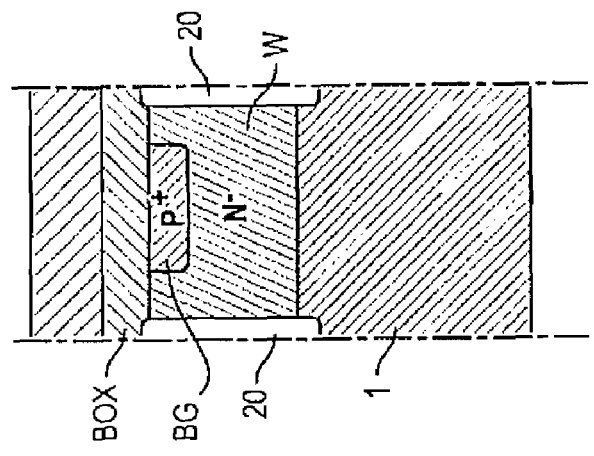
Figure 10C:
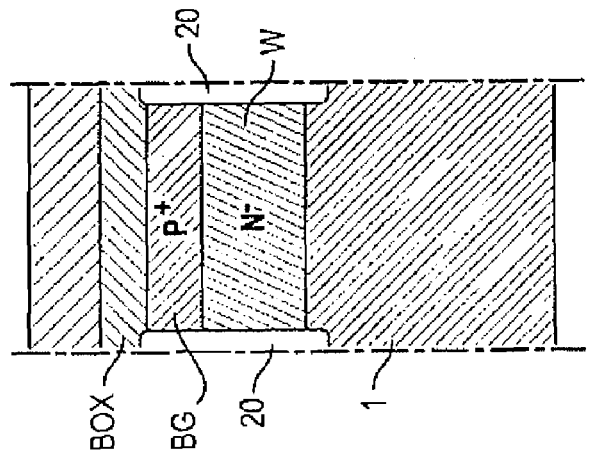

According to a first embodiment represented in FIGS. 10c and 10e, the back control gate BG extends under the entire width of the cell. According to another embodiment represented in FIGS. 10a, 10b and 10d, the back control gate BG is located so as to extend only facing the floating channel (DRAM case) or the floating gate (Flash case).

As represented in FIG. 10a, the back control gate BG is insulated from the base substrate 1 by a well W of opposite bias (N-type well for a P+ back control gate with working function for an N-type transistor). The well voltage is chosen so that the parasitic diode created by the electrical node between the back control gate and the well is always reversed, the diode isolating the back control gate from the well and from anything that it might contain (other back control gates in particular).

In the case where the back control gate extends under the entire width of the cell, it is also necessary to provide lateral insulating regions 20 extending depth-wise into the base substrate 1 so as to insulate the back control gate from the base substrate. In FIG. 10c, the lateral insulating regions 20 are buried under the insulating layer (BOX). In FIG. 10e, the lateral insulating regions 20 extend from the surface, through the insulating layer (BOX).

Such lateral insulating regions 20 can also be provided when the back control gate is localized by thus contributing to the insulation of the wells. In particular, it may in this case be necessary to produce wells only for a single back control gate bias (for example N− well for insulating P+ back control gate whereas an N+ back control gate would be arranged directly in the P− biased base substrate). In FIG. 10b, the lateral insulating regions 20 are buried under the insulating layer (BOX). In FIG. 10d, the lateral insulating regions 20 extend from the surface through the insulating layer (BOX).

According to a variant embodiment not represented, a second insulating layer, arranged in the base substrate below the insulating layer BOX, can contribute, wholly or partly, to the insulation of a back control gate from the base substrate.

Returning to the description of the data comparison device according to the first embodiment of the invention, the comparison circuit is also configured to detect the presence or the absence of current on the source line SL linked to the source of each of the transistors to indicate whether the proposed bit DATA and the data bit BIT are identical or not. More specifically, the absence of current signifies a match between BIT and DATA (the passing transistor has indeed been blocked so that the cell with two transistors supplies no current to the source line), whereas the presence of current signifies that DATA is different from BIT (the passing transistor has not been blocked and the cell is supplying current to the source line).

Figure 2:
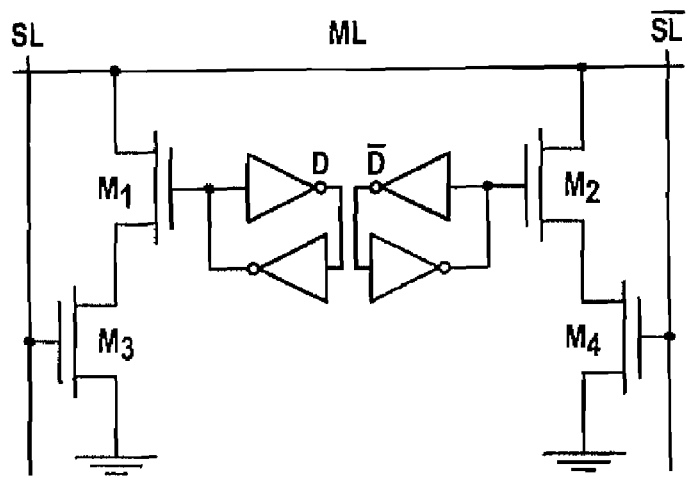

It will be noted that, for the conventional CAM memories of FIGS. 1 and 2, a specific line (generally designated "match line") is provided to supply the result of the comparison. This line is different from earth. It also requires the production of interconnects, which is made possible by the relatively large size of the cell (10 or 16 transistors).

In the context of the invention, the source line (generally used as earth for the cells) is used as "match line". This makes it possible to avoid having to produce interconnects, while the cell comprises only two transistors and therefore has a minimal footprint.

Moreover, the source line is parallel to the word line, and therefore common to all the bits of a stored word. It is thus possible to make a comparison between one (or more) stored word(s) and a proposed word, in parallel, over all the bits of the word.

Given that the electrical function of the source line in the cell is primarily to form the earth, the voltage of the source line is 0V (or as close as possible) in all circumstances to ensure correct operation of the cells. On the other hand, it is possible to measure the presence or the absence of current in this line, the current being able to flow at any voltage, provided that the line has a relatively low impedance.

The presence of current on the source line may be due to any bit of the word, which corresponds to a difference between the stored word and the proposed word in the comparison. Only a perfect match of all the bits will induce an absence of current in the source line.

Figure 4:
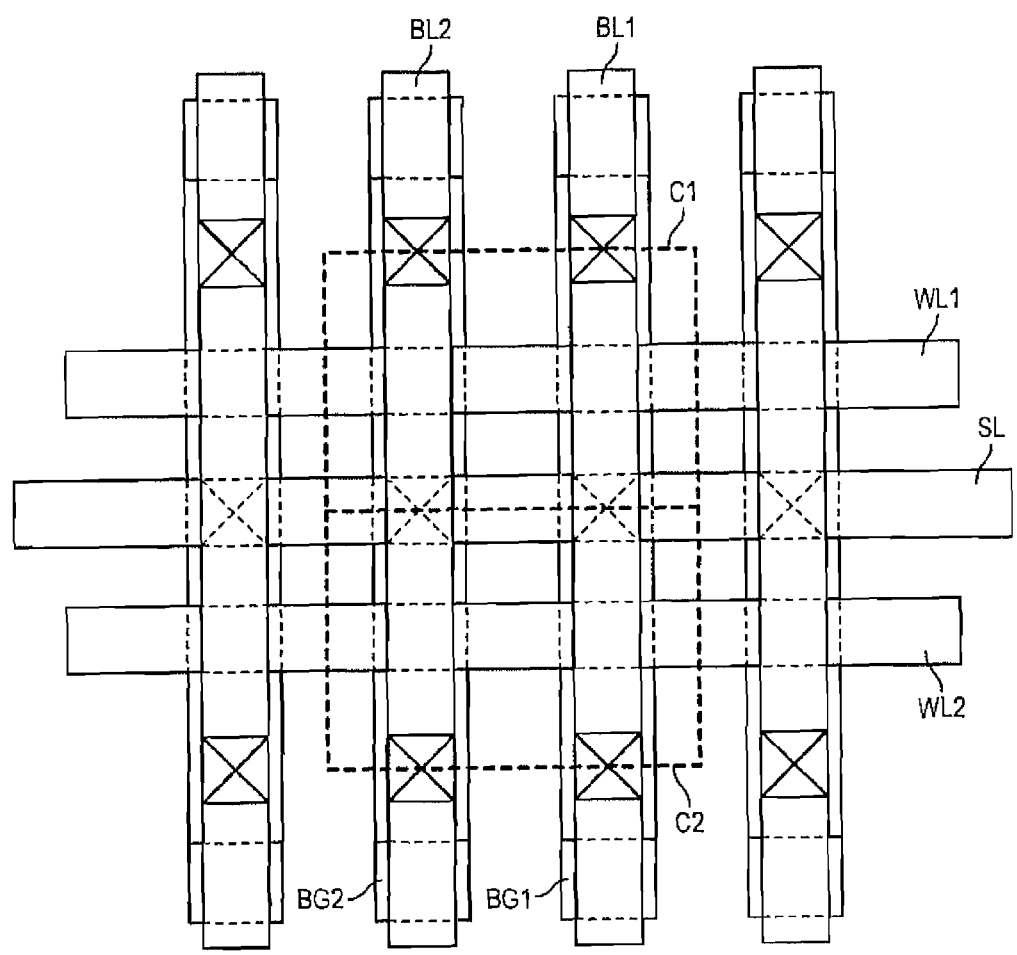
FIG. 4 illustrates a preferential topology of a CAM memory array according to the invention.

FIG. 4 represents a preferential topology of a CAM memory array according to the invention. In this figure, the dotted lines identify adjacent CAM memory cells C1 and C2 as described previously. It will be noted that, advantageously, the source line SL is common to the two adjacent cells C1 and C2 along an active region strip (the cell C1 being addressed by the word line WL1, the cell C2 being addressed by the word line WL2). The selective activation of WL1 or WL2 thus makes it possible to compare a proposed bit with one or other of the bits stored in the cells C1 and C2.

Figure 5:
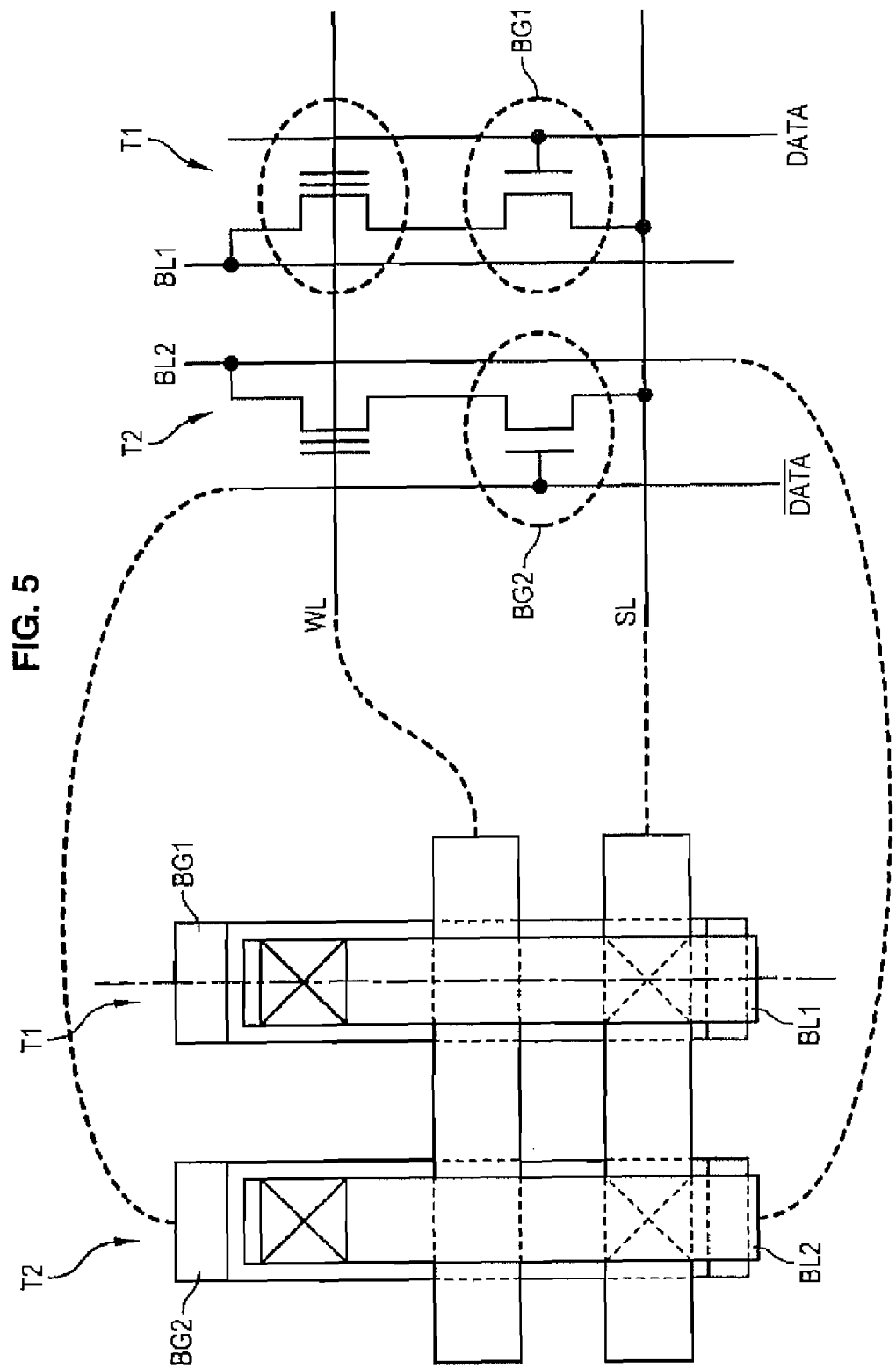
FIG. 5 illustrates an equivalent circuit diagram of a CAM memory cell according to the invention.

On the right of FIG. 5 is an equivalent circuit diagram of the CAM cell according to the invention. In as much as each transistor has two control gates (a front control gate and a back control gate), each transistor functions as two transistors in series. The cell thus works like a cell with four transistors. The interest in using transistors that have a back control gate is that the latter are much smaller than two transistors in series.

Figure 6:
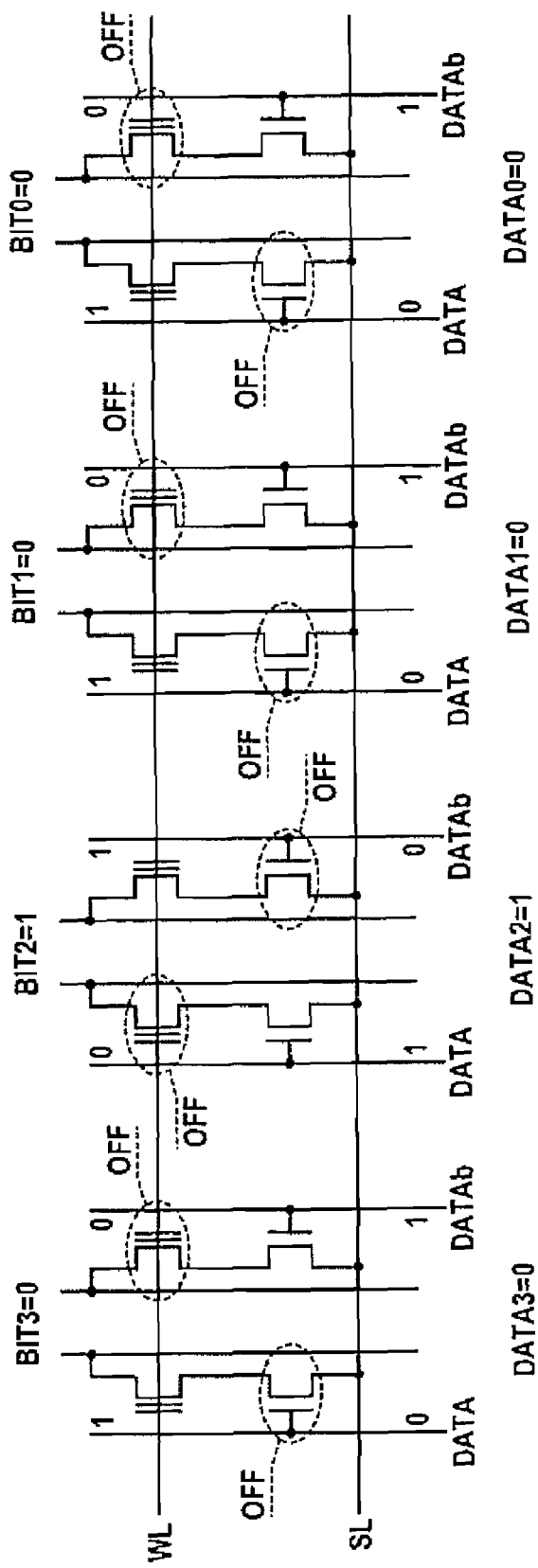
FIG. 6 illustrates a comparison operation between a proposed 4-bit word and a word stored in 4 CAM memory cells according to the invention in the case of a match between the proposed word and the stored word.

Referring to FIG. 6, this shows an exemplary comparison of a proposed word (comprising four bits: 0100) with a word stored in four CAM cells according to the invention. The cells are arranged on one and the same line of a memory array such that the transistors of these cells share the same word line WL and the same source line SL.

When the proposed bits (DATA3-DATA2-DATA1-DATA0) are identical to the stored bits (BIT3-BIT2-BIT1-BIT0), no current flows on the source line SL. Taking the example of the proposed bit DATA0=0, the first transistor of the cell stores BIT0=0, while the second transistor of the cell stores the complementary bit ~BIT0=1. In normal read operation (via the application of a nominal read voltage VDD to the word line WL, and a voltage of around VDD/2 to the bit line BL1, BL2 of each of the first and second transistors), the first transistor is blocked, while the second is passing. In the case of action with the working function, the comparison circuit according to the invention is configured to perform this normal read operation while applying the ~DATA value to the back control gate of the first transistor and the DATA value to the back control gate of the second transistor. The second transistor is then blocked by its back control gate (the latter is OFF because controlled by DATA0=0). It follows from this that this cell delivers nothing to the source line SL.

If a perfect match is observed between all the bits of the proposed word and the stored bits, no current flows on the source line. It will be noted that there is no constraint on the width (number of bits) of the proposed word.

Figure 7:
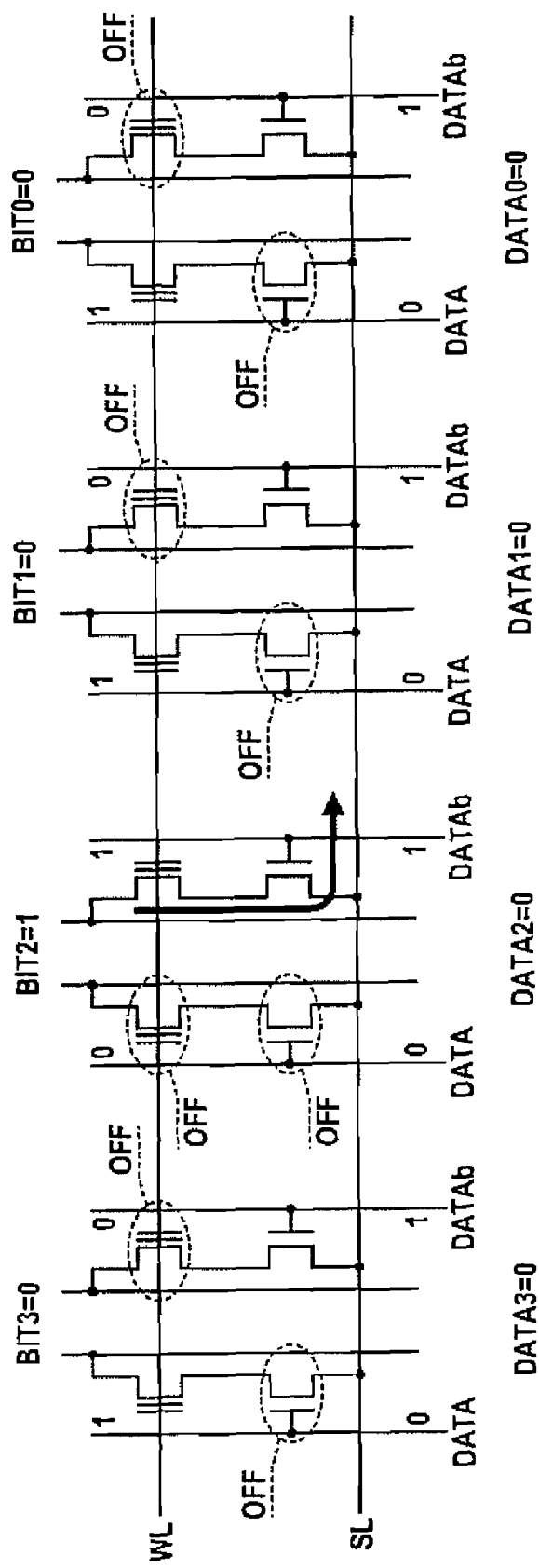
FIG. 7 illustrates a comparison operation between a proposed 4-bit word and a word stored in 4 CAM memory cells according to the invention in the case of a non-match between the proposed word and the stored word.

Referring to FIG. 7, this shows the same exemplary comparison of a proposed word of 4 bits 0100. In this FIG. 6, there is no match between the bit DATA2=0 of the proposed word and the stored bit BIT2=1. Taking the example of the proposed bit DATA2=0, the first transistor of the cell stores BIT2=I, while the second transistor of the cell stores the complementary bit ~BIT2=0. In normal read operation, the first transistor is passing, while the second is blocked. The comparison circuit according to the invention is configured to perform this normal read operation while applying the ~DATA value to the back control gate of the first transistor and the DATA value to the back control gate of the second transistor. The first transistor then remains passing (its back control gate is ON because controlled with ~DATA2=1). This cell then delivers current to the source line SL. The presence of the current, which may be due to any bit of the word, thus corresponds to a difference between the proposed word and the stored word.

Referring to FIG. 8, this shows a ternary comparison corresponding to a "don't care" situation on proposed bit DATA1. For such a ternary comparison, both back control gates of the corresponding CAM cell (storing BIT1) are forced to OFF, so that the passing transistor becomes blocked and no current is then delivered to the source line. The comparison on the bit BIT1 has thus been blocked. Such a ternary comparison corresponds, for example, to a search on words that are incomplete or contain faults.

As a variant, the two transistors can be controlled for each to store a "0". The comparison on the bit is then blocked, no current being able to be delivered on the source line by this pair of transistors. Such a variant corresponds, for example, to a search in a database that may contain "spelling errors".

This completes the description of comparison operations between proposed bits and the bit stored in the CAM cell according to the invention.

The read, programming, erase and hold operations of this cell are now described. These operations are performed in a manner known conventionally with regard to the voltages to be applied to the front control gate and to the drain of each transistor. With respect to the read, programming and erase modes, a control circuit also controls the back control gate of each of the transistors with substantially the same voltages chosen such that the passing transistor is not blocked. In the example described here, the back control gate of each of the two transistors is thus ON during these operations.

Although not mandatory, different operation can be provided for the hold mode, the control circuit then being configured to control the back control gate of each of the transistors with substantially the same voltage chosen such that the passing transistor is blocked. In the example described here, the back control gate of each of the two transistors would thus be OFF so as to reduce the power consumption during this hold operation.

A truth table for a CAM cell according to the invention is thus as follows.

| DATA | ~DATA | BIT | ~BIT | MODE | |
|------|-------|-----|------|------|---|
| X | X | 1 | 1 | Prohibited (this mode is technically possible, but it is avoided because it would systematically create a non-match result in the comparison modes) | |
| 1 | 1 | — | — | Read, programming, erase | |
| 0 | 0 | — | — | Hold | |
| 0 | 0 | X | X | Comparison | Ternary "don't care" |
| X | X | 0 | 0 | | Ternary "don't care" |
| 0 | 1 | 0 | 1 | Match | |
| 1 | 0 | 0 | 1 | Non-match | |
| 0 | 1 | 1 | 0 | Non-match | |
| 1 | 0 | 1 | 0 | Match | |

It will be understood that the invention is not limited to the comparison device according to the first embodiment described above, but also extends to a content-addressable memory cell, to a method for comparing data in a content-addressable memory implementing the principles described above, and to a content-addressable memory comprising a plurality of cells, each cell having two transistors according to the invention, the cells being arranged in lines and columns.

The invention offers the following particular advantages.

Firstly, by limiting to two the number of transistors needed to fulfil the comparison function, the surface area occupied by the CAM cell is considerably reduced. Depending on the technological process used, the CAM cell of the invention occupies around 8 $F^2$ in memory process, at least 30 $F^2$ in logic process (to be compared with 300 $F^2$ for the conventional binary CAM cell, and with 500 $F^2$ for the conventional ternary CAM cell).

Moreover, in the invention, the same cell can be used to perform a binary comparison or a ternary comparison.

The comparison speed is similar to that of the conventional cells.

The CAM memory according to the invention does not need any power supply line so that neither leaks nor power losses are observed in the memory array.

The comparison is selected via the word line, which is not possible with the conventional cells. It is therefore possible to choose simply the number of words compared simultaneously without being constrained by the architecture of the memory circuit (size of the arrays, in particular).

The CAM cell according to the invention operates at low power.

The CAM memory is relatively easy to design: it comprises only long rectilinear regions for all the layers, the contacts being established according to regular arrays.

When the CAM cell according to the invention uses flash transistors, the initial programming is relatively slow compared to a CAM cell with SRAM transistors. However, the CAM cell according to the invention consumes less power and has smaller dimensions. The CAM cell can also be used only for information that is infrequently addressed.

When the CAM cell according to the invention uses DRAM transistors, a periodic refresh of the content is needed, but the programming is significantly faster than with flash transistors. This variant embodiment can advantageously be used to produce the memory buffers (usually called Caches L1, L2, L3) of a microprocessor.

The word "substantially" is used herein to refer to a result that is complete except for the deficiencies normally expected in the art. For example, voltages are "substantially the same" if they are close enough to be the same in their relevant effects (ex., the control of back control gates). The words "significant" and "likely" (and similar words of degree) are used here to mean within acceptable and expected limits, usually commercially-acceptable limits. It should be understood that this invention is not limited to commercial uses; intended uses include research uses, special purpose uses, and so forth.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

What is claimed is:

1. A semiconductor device for comparing data in a content-addressable memory, comprising:
    a semiconductor-on-insulator (SeOI) substrate;
    a memory cell formed in the SeOI substrate, the memory cell including a first transistor and a second transistor, each of the transistors having a front control gate and a back control gate that can be controlled to block the associated transistor, the transistors being configured so that, in order to store a data bit (BIT) and the complement of the data bit (~BIT), with one of the transistors passing and the other blocked; and
    a comparison circuit configured to operate the transistors in read mode by applying to both front control gates a nominal read voltage, to control the back control gates so as to block the passing transistor if a proposed bit (DATA) and the stored bit (BIT) correspond, and to detect a current on a source line linked to the source of each of the transistors,
    wherein the presence or absence of such a current indicates whether the proposed bit (DATA) and the stored bit (BIT) are identical or not.

2. The semiconductor device of claim 1, wherein the comparison circuit is configured to supply one back control gate with the complement of a proposed bit (~DATA) and to supply the other back control gate with the proposed bit (DATA).

3. The semiconductor device of claim 1, wherein the SeOI substrate comprises a thin semiconductor film separated from a base substrate by an insulating layer, and wherein the back control gate of at least one transistor is arranged in the base substrate beneath the insulating layer and facing the channel of the associated transistor.

4. The semiconductor device of claim 1, wherein the back control gate of at least one of the transistors is isolated in the base substrate by a well of opposite bias.

5. The semiconductor device of claim 1, wherein the back control gate of each of the transistors has a working function.

6. The semiconductor device of claim 1, wherein the comparison circuit is further configured to perform a ternary operation during which the stored bit is disregarded.

7. The semiconductor device of claim 6, wherein, during the ternary operation, the comparison circuit is further configured to operate the first and the second transistors in read mode, and to control both back control gates with substantially the same voltage chosen so as to block the passing transistor.

8. The semiconductor device of claim 1, further comprising a circuit for controlling the memory cell that is configured to operate the transistors in one or more of read, programming and erase modes, and to control both back control gates with substantially the same voltage chosen so that the passing transistor is not blocked.

9. The semiconductor device of claim 1, further comprising a circuit for controlling the memory cell that is configured to operate the transistors in a holding mode, and to control both back control gates with substantially the same voltage chosen so that the passing transistor is blocked.

10. The semiconductor device of claim 1, further comprising two parallel back gate lines, each of the back gate lines being linked to the back control gate of one of the transistors.

11. The semiconductor device of claim 10, further comprising a word line that links the front control gates of the transistors, the word line being perpendicular to the back gate lines.

12. The semiconductor device of claim 1, wherein the transistors are floating gate FET transistors, wherein the SeOI substrate comprises a thin semiconductor film separated from a base substrate by an insulating layer, and wherein the back control gate of at least one of the transistors is arranged in the base substrate so as to be separated from the channel of the associated transistor by the insulating layer.

13. The semiconductor device of claim 1, wherein the transistors are floating channel FET transistors, wherein the SeOI substrate comprises a thin semiconductor film separated from a base substrate by an insulating layer, and wherein the back control gate of at least one transistor is arranged in the base substrate so as to be separated from the channel of the associated transistor by the insulating layer.

14. A content-addressable memory cell comprising:
    a semiconductor-on-insulator (SeOI) substrate;
    a first transistor formed in the substrate and designed to store a data bit (BIT);
    a second transistor formed in the substrate and designed to store the complement of the data bit (~BIT), wherein each of the transistors has a source, a drain, a front control gate and a back control gate that can be controlled to block the associated transistor;
    a source line linked to the source of each of the transistors; and
    two back gate lines, each back gate line being associated with the back control gate of one of the transistors, and the back gate lines being parallel with one another and perpendicular to the source line.

15. The cell of claim 14, further comprising a word line linked to the front control gate of each of the transistors, the word line being parallel to the source line.

16. A content-addressable memory comprising a plurality of the memory cells of claim 14 arranged in lines and columns.

17. A method of comparing data in a content-addressable memory, the memory comprising at least one memory cell formed in a semiconductor-on-insulator (SeOI) substrate and including at least two transistors, each transistor having a front control gate and a back control gate that can be controlled to block the associated transistor, the transistors being configured so that, in order to store a data bit (BIT) and the complement of the data bit (~BIT), one of the transistors is passing and the other is blocked, the method comprising:
    operating the transistors in read mode by applying to both front control gates of the transistors a nominal read voltage;

controlling both back control gates so as to block the passing transistor if a proposed bit (DATA) and the stored bit (BIT) correspond, and detecting current on a source line linked to the source of each of the transistors, wherein the presence or absence of such a current indicates whether the proposed bit (DATA) and the stored bit (BIT) are identical or not.

18. The method of claim 17, wherein one back control gate is controlled with the complement of a proposed bit (~DATA) and the other back control gate is controlled with the proposed bit (DATA).

* * * * *